US012685172B2

(12) United States Patent
Reber et al.

(10) Patent No.: US 12,685,172 B2
(45) Date of Patent: Jul. 14, 2026

(54) INTEGRATED CIRCUIT WITH DIELECTRIC LAYER HAVING SELECTIVELY IMPLANTED STRESS-SETTING DOPANTS

(71) Applicant: NXP USA, INC., Austin, TX (US)

(72) Inventors: Douglas Michael Reber, Austin, TX (US); Ertugrul Demircan, Eugene, OR (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 404 days.

(21) Appl. No.: 18/475,419

(22) Filed: Sep. 27, 2023

(65) Prior Publication Data

US 2025/0105171 A1     Mar. 27, 2025

(51) Int. Cl.
*H10W 72/90*     (2026.01)
*H10W 20/42*     (2026.01)
*H10W 42/00*     (2026.01)
*H10W 72/20*     (2026.01)
*H10W 72/29*     (2026.01)

(52) U.S. Cl.
CPC ......... *H10W 42/121* (2026.01); *H10W 20/42* (2026.01); *H10W 72/222* (2026.01); *H10W 72/252* (2026.01); *H10W 72/29* (2026.01); *H10W 72/90* (2026.01); *H10W 72/923* (2026.01); *H10W 72/952* (2026.01)

(58) Field of Classification Search
CPC ... H10W 20/095; H10W 20/42; H10W 20/48; H10W 42/121; H10W 72/20; H10W 72/222; H10W 72/252; H10W 72/29; H10W 72/90; H10W 72/923; H10W 72/952; H10W 72/981; H01L 21/76825; H01L 23/5226; H01L 23/5329; H01L 23/562; H01L 24/05; H01L 24/13; H01L 2224/02123; H01L 2224/0401; H01L 2224/05082; H01L 2224/05085; H01L 2224/05089; H01L 2224/05124; H01L 2224/05573; H01L 2224/13082; H01L 2224/13147
See application file for complete search history.

(56) References Cited

U.S. PATENT DOCUMENTS

| | | | |
|---|---|---|---|
| 7,119,404 B2 | 10/2006 | Chang et al. | |
| 7,494,902 B2 | 2/2009 | Jurczak et al. | |
| 7,538,339 B2 | 5/2009 | Greene et al. | |
| 10,651,287 B2 | 5/2020 | More et al. | |

(Continued)

OTHER PUBLICATIONS

Bagolini, A., "PECVD low stress silicon nitride analysis and optimization for the fabrication", Journal of Micromechanics and Microengineering, Jan. 2015.

(Continued)

*Primary Examiner* — Nelson Garces

(74) *Attorney, Agent, or Firm* — David G. Dolezal

(57) ABSTRACT

An integrated circuit includes a dielectric layer located over one or more metal interconnect layers. The dielectric layer includes selective regions of implanted stress-setting dopants to provide different stress profiles in the dielectric layer to counteract the stress imparted from package structures. Accordingly, the effect of the stress imparted by package structures in a substrate can be negated by the placement of stress-setting dopants in selective areas of the dielectric layer.

19 Claims, 10 Drawing Sheets

(56) References Cited

U.S. PATENT DOCUMENTS

| | | |
|---|---|---|
| 11,189,589 B2 | 11/2021 | Wang et al. |
| 2009/0289284 A1 | 11/2009 | Goh et al. |
| 2023/0069557 A1 | 3/2023 | Cheng et al. |
| 2023/0230846 A1 | 7/2023 | Lin et al. |
| 2025/0062136 A1* | 2/2025 | Chung .................... H01L 25/18 |
| 2025/0063768 A1 | 2/2025 | Reber et al. |

OTHER PUBLICATIONS

Borland, J., "High Electron and Hole Mobility By Localized Tensile & Compressive Strain Formation Using Ion Implantation and Advanced Annealing of Group IV Materials (Si+C, Si+Ge & Ge+Sn)", ESC Transactions, Feb. 2016.

Chan, V., "Strain for CMOS performance Improvement", IEEE 2005 Custom Integrated Circuits Conference, Sep. 21, 2005.

Cisternino, S., "The Way of Thick Films toward a Flat Q-curve in Sputtered Cavities", 18th International Conference on RF Super-conductivity, Jul. 2017.

Eernisse, E.P., "Stress in ion-implanted CVD Si3N4 films", Journal of Applied Physics, Abstract, Aug. 26, 2008.

Grudowski, P., "1-D and 2-D Geometry Effects in Uniaxially-Strained Dual Etch Stop Layer Stressor Integrations", 2006 Symposium on VLSI Technology, Digest of Technical Papers, Jun. 13-15, 2006.

Iliescu, C., "Residual Stress in Thin Films PECVD Depositions: A Review", Journal of Optoelectronics and Advanced Materials, Apr. 2011.

Lachal, L., "Nitride stress inversion using plasma immersion ion implantation processes", MRS Advances, Jan. 4, 2023.

Li, D., "A new SILO process for VLSI isolation using N2+ ion implantation", Science Direct, Abstract, 1989 (no month available).

Mackenzie, K., "Stress Control of Si-based PECVD Dielectrics", ECS Meeting Abstracts, Jan. 2005.

Pidin, J., "A Novel Strain Enhanced CMOS Architecture Using Selectively Deposited High Tensile And High Compressive Silicon Nitride Films", IEDM Technical Digest, IEEE International Electron Devices Meeting, Dec. 13-15, 2004.

Shi, W., "Modifying Residual Stress and Stress Gradient in LPCVD $SI_3N_4$ Film with Ion Implantation", Science Direct article, Aug. 14, 2006.

Ojha, A., "A Channel Stress-Profile-Based Compact Model for Threshold Voltage Prediction of Uniaxial Strained HKMG nMOS Transistors", Journal of the Electron Devices Society, Digital Object Identifier 10.1109/JEDS.2016.2524536, Feb. 23, 2016.

Ziegler, J., "Interactions of Ions with Matter: SRIM—The Stopping and Range of Ions in Matter; SER—Soft Error Rates from Cosmic Rays", SRIM textbook, 2013 (no month available).

* cited by examiner

1001

1003
DEVELOP DESIRED CHANNEL STRESS
PROFILE BASED ON TRANSISTOR TYPE

1005
DEVELOP CUMULATIVE STRESS
PROFILE OF PACKAGE STRUCTURE STRESS

1007
DETERMINE STRESS-SETTING DOPANT REGIONS
BASED ON DESIRED STRESS PROFILE AND
CUMULATIVE STRESS PROFILE

1009
MANUFACTURE INTEGRATED CIRCUITS
WITH DESIGNED STRESS-SETTING DOPANT REGIONS

1011
FORM PACKAGED INTEGRATED CIRCUITS

INTEGRATED CIRCUIT WITH DIELECTRIC LAYER HAVING SELECTIVELY IMPLANTED STRESS-SETTING DOPANTS

BACKGROUND OF THE INVENTION

Field of the Invention

This invention relates in general to integrated circuits with a dielectric layer having regions of selectively implanted stress-setting dopants.

Description of the Related Art

Integrated circuits utilize stressors for applying stress to the active regions of transistors to improve transistor performance. A stressor is a dielectric structure that is formed to induce a stress (either compressive or tensile) on surrounding structures of an integrated circuit. A compressive stressor imparts a compressive stress on a structure directly beneath the compressive stressor. Compressive stressors are formed from a dielectric material (e.g., silicon nitride) and are under a tensile stress when formed. A tensile stressor imparts a tensile stress on structures directly beneath the tensile stressor. A tensile stressor is formed from a dielectric material (e.g., silicon nitride) and is under a compressive stress when formed. Structures that are formed neither to impart a compressive or tensile stress are characterized as neutral.

With some integrated circuits that include field-effect transistors (FETs), imparting a stress on the channel region can improve carrier mobility. Changing carrier mobility can affect the drive current and threshold voltage of a transistor. For a particular semiconductor substrate with a given crystal orientation, carrier mobility (e.g., electron mobility) in the channel region of an N-type FET (NFET) can be improved by imparting a tensile stress in both the longitudinal and lateral directions of the channel region. The longitudinal direction is the direction of carrier flow in the channel region and the lateral direction is laterally perpendicular to the direction of carrier flow in the channel region. For a particular semiconductor substrate with a given crystal orientation, carrier mobility (e.g., hole mobility) in the channel region of a P-type FET (PFET) can be improved by imparting a compressive stress on the channel in the longitudinal direction and a tensile stress in the lateral direction. However, with other transistors or substrates with different crystal orientations, channel stress may affect transistor performance differently.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of at least one mode for carrying out the invention. The description is intended to be illustrative of the invention and should not be taken to be limiting.

As disclosed herein, an integrated circuit includes a dielectric layer located over one or more metal interconnect layers. The dielectric layer includes selective regions of implanted stress-setting dopants to provide different stress profiles in the dielectric layer to counteract the stress imparted from package structures. Accordingly, the effect of the stress imparted by package structures in a substrate can be negated by the placement of stress-setting dopants in selective areas of the dielectric layer.

Figure 1:
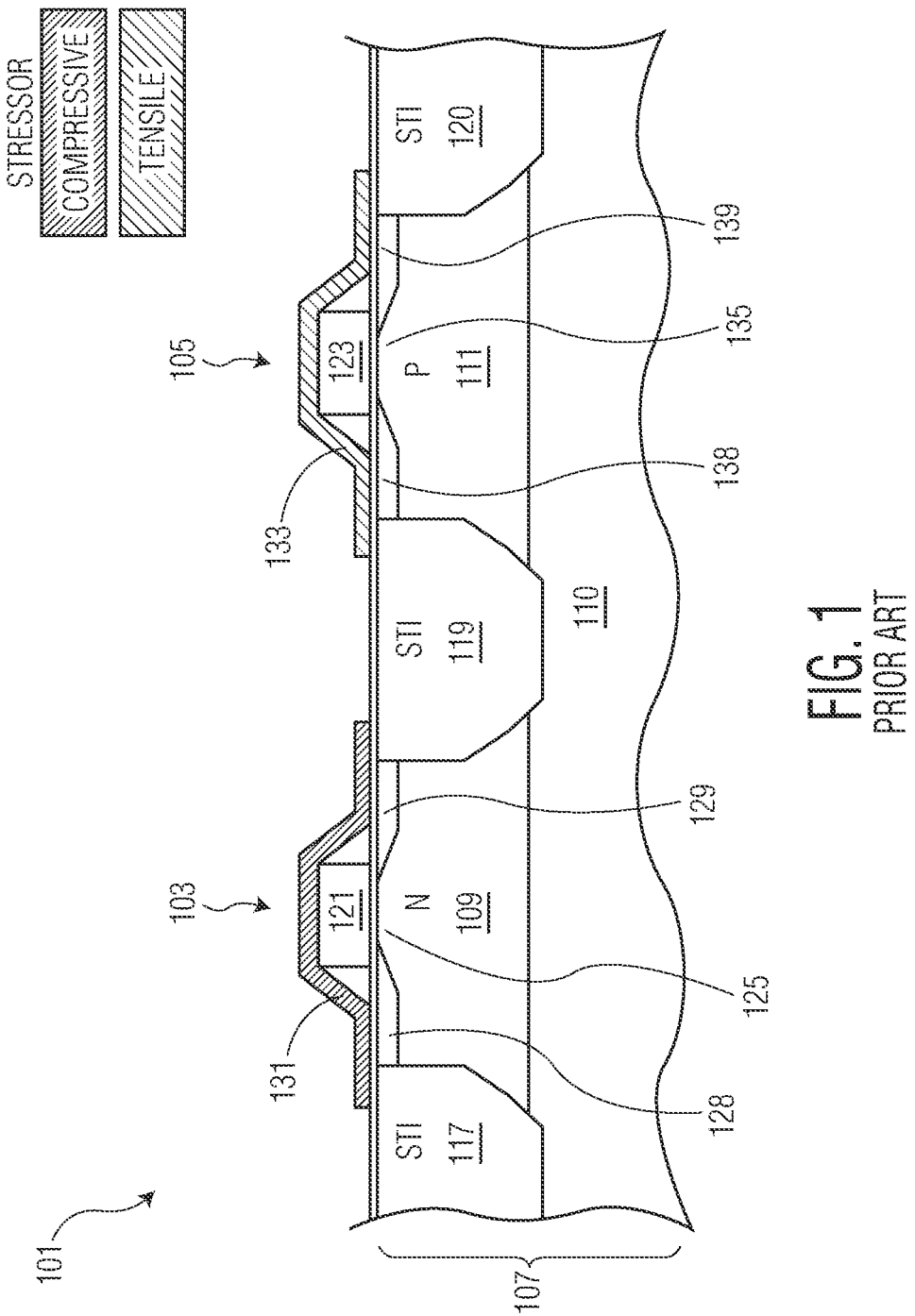
FIG. 1 is a partial cross-sectional side view of a prior art integrated circuit.

FIG. 1 is a partial cross-sectional side view of a prior art integrated circuit 101. FIG. 1 shows a PFET 103 and an NFET 105, each including an active region located in a substrate 107. Not shown in FIG. 1 are interconnect layers located above the structures shown in FIG. 1 that include conductive interconnects, vias, die terminals, and include intervening dielectric material. PFET 103 includes a gate 121 located over an active region located between shallow trench isolation (STI) structures 117 and 119, and also includes a P-type source region 128, a P-type drain region 129, and an N-type well (N-well) region 109. A conductive channel region 125 is formed between source region 128 and drain region 129 in well region 109 directly below gate 121 when a voltage is applied to gate 121 that is below the threshold voltage of PFET 103.

NFET 105 includes a gate 123 located over an active region located between shallow trench isolation structures 119 and 120 that includes an N-type source region 138, an N-type drain region 139, and a P-type well (P-well) region 111. A conductive channel region 135 is formed between source region 138 and drain region 139 in well region 111 when a voltage is applied to gate 121 that is above the threshold voltage of NFET 105.

A compressive stressor 131 is located directly over PFET 103 and is made of a patterned layer of silicon nitride that is under a tensile stress. Stressor 131 imparts a desired amount of compressive stress on channel region 125 in the direction of carrier flow to increase carrier flow during transistor conductivity.

A tensile stressor 133 is located directly over NFET 105 and is made of a patterned layer of silicon nitride that is under a compressive stress. Stressor 133 imparts a desired amount of tensile stress in channel region 135 in the direction of carrier flow to increase the carrier flow during transistor conductivity.

Stressors 131 and 133 are configured, e.g., size, position, thickness, and amount of internal stress, to impart a desired amount of stress on the channel region to improve carrier mobility in the transistor. However, other package structures (not shown in FIG. 1) of a packaged integrated circuit implementing integrated circuit 101, such as metal interconnect structures in the die interconnect layer, external die terminals (e.g., bond pads, pillars, bumps), metal plates, solder, packaging boards, and package encapsulate (see FIG. 5), may also impart a stress on the channel region that can counter or add to the stress provided by stressors 131 and 133, such that the desired amounts of stress are not provided to the channel regions. Furthermore, the stress caused by packaged structures is not necessarily uniform across the integrated circuit, but may be dependent upon the distances of the package structures to the channel region. Because the compressive stressors may be patterned from a single layer and the tensile stressors may be patterned from a single layer, the parameters for the layer to have a desired stress cannot be altered to account for variations of package structure stress due to location. Accordingly, transistor mobility may vary based on transistor location in the integrated circuit. Such a variation in carrier mobility may lead to a drive current and voltage threshold variation based on transistor location. Such a variance is undesirable for proper integrated circuit operation.

Figure 2:
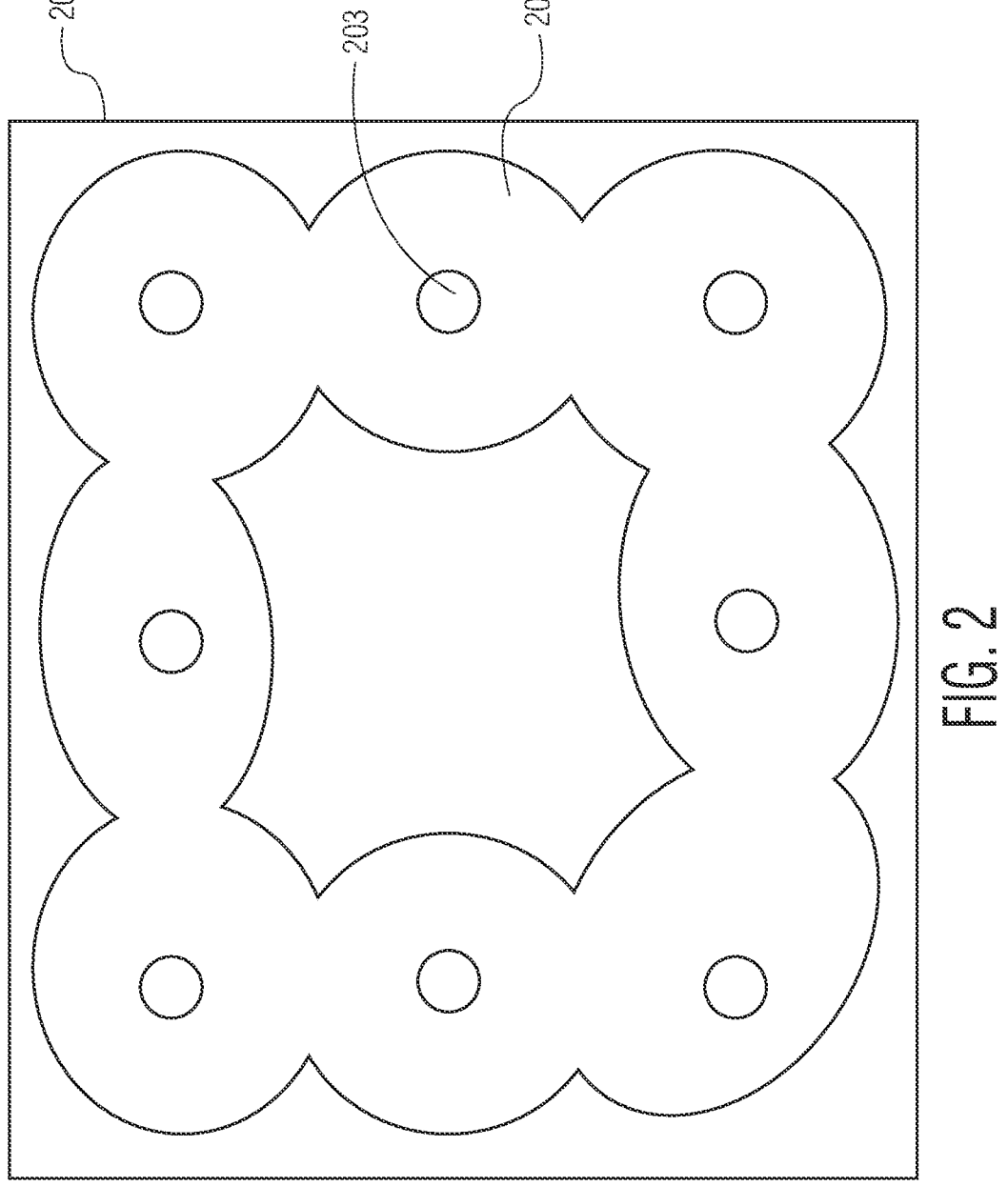
FIG. 2 is a top view of a prior art integrated circuit illustrating how die terminal stress affects different areas of a substrate.

FIG. 2 is a top view of an integrated circuit 201 showing areas of stress variation on the channel regions due to external die terminals (e.g., bond pads, pillars, bumps, posts). In one embodiment, such stress can occur from a mismatch in temperature coefficients of expansion between the die terminal and laminate. The smaller identified areas (e.g., 203) in FIG. 2 represent the approximate locations of the external die terminals where the maximum amount of stress affects the channel regions of transistors in those areas. The areas 205 surrounding the smaller areas represent areas of moderate stress from the external die terminals. As shown in FIG. 2, the stress due to a die terminal tends to decrease with increased distance away from the terminal. The stress of an external die terminal not only includes the stress imparted by the die terminal structures themselves but also from the stress of other packages structures mechanically coupled to the terminal. Also, the amount of stress imparted by a die terminal may be dependent upon the location of the die terminal. For example, corner die terminals may impart a greater stress on a substrate than internal die terminals.

In some embodiments, the stress imparted on a substrate may be compressive. In other embodiments, the stress may be tensile. In still other embodiments, the stress may be compressive directly underneath the die terminal and tensile in areas radiating out from the die terminal. In still other embodiments, the stress may be tensile in one direction and compressive in a second direction.

In some embodiments, a copper pillar die terminal may impart a threshold voltage shift from −1.3 to 0.4 mV (millivolts) on FETs with channels in the substrate. In some embodiments, a relationship of threshold-voltage shift to stress can be characterized as 30 mV/0.12 GPa.

In addition, stress caused by packaging structures may affect the operability of other semiconductor devices (e.g., diodes, bipolar transistors) that include semiconductor regions in a substrate. Furthermore, such package structure stress may contribute to tensions in the package that may affect package durability (e.g., delamination, corrosion, cracking).

Some integrated circuits may utilize semiconductor device exclusion-zones under the die terminals as a way to avoid the effects of stress imparted by the die terminals. However, as the area of integrated circuits decrease, utilization of exclusion zones may be impractical.

As described herein, utilizing stress-setting dopants in the selective regions of a dielectric layer such as a passivation layer located above one or more metal interconnect layers can alter the stress profile of the dielectric layer to counter the effects of stress induced by the package structures on semiconductor regions of the substrate.

Figure 3:
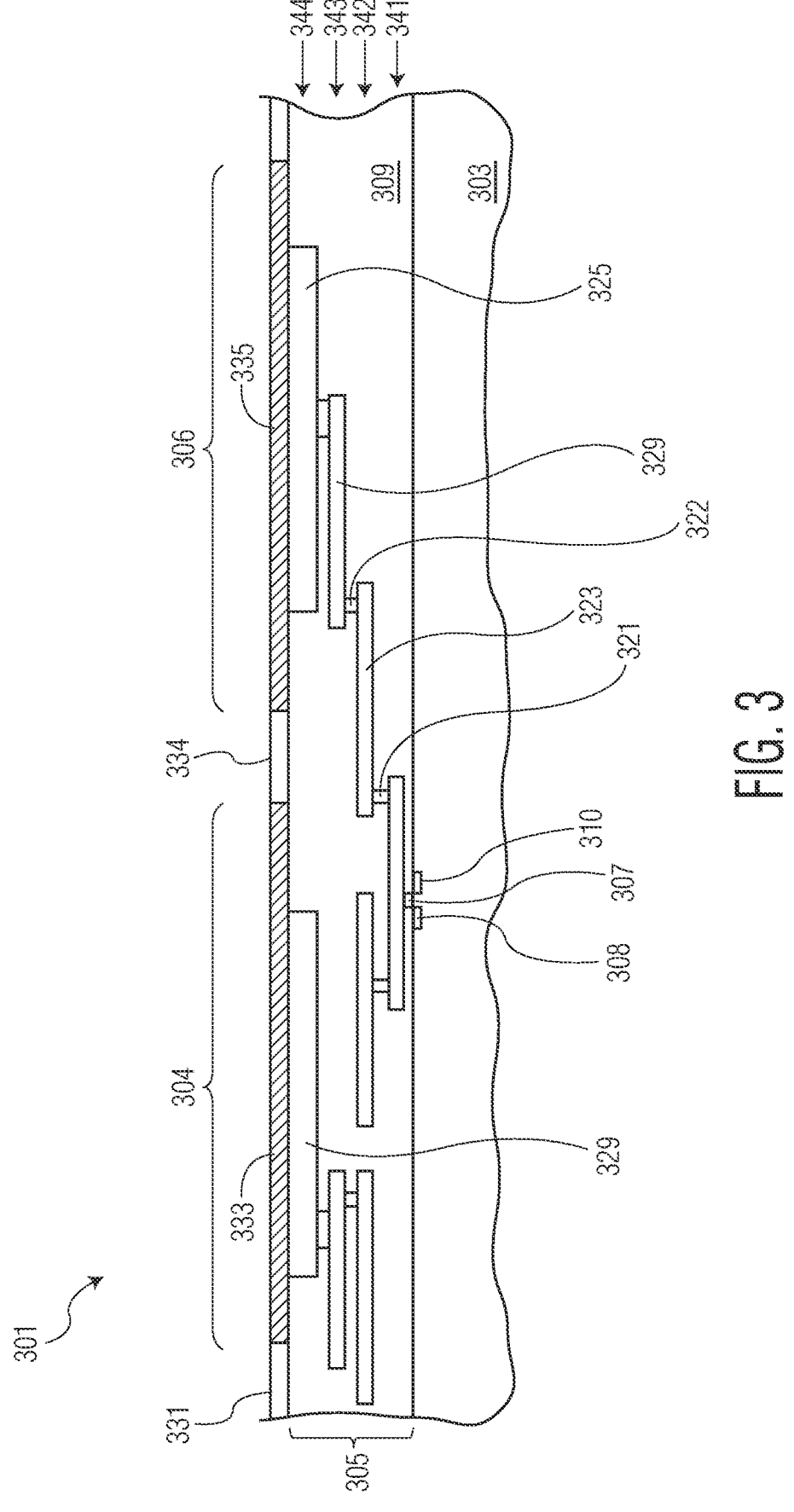
FIG. 3 is a partial cross-sectional side view of a wafer during a stage of its manufacture according to one embodiment of the present invention.

FIG. 3 is a partial cross-sectional side view of a wafer 301 during a stage in its manufacture according to one embodiment of the present invention. Wafer 301 includes a substrate 303 that is made of one or more semiconductor materials such as e.g., monocrystalline silicon, silicon germanium, silicon carbide, gallium nitride, gallium arsenide, or other III-V semiconductor material. In one embodiment, substrate 303 has a bulk-semiconductor configuration. In other embodiments, substrate 303 may have an SOI (semiconductor on insulator) configuration. In some embodiments, substrate 303 is formed from a singulated portion of an integrally grown semiconductor material. In other embodiments, portions of substrate 303 may include epitaxially grown semiconductor material. Substrate 303 may also include dielectric structures (e.g., shallow trench isolation structures, buried oxide layers (not shown)).

Substrate 303 includes semiconductor regions for multiple semiconductor devices (e.g., transistors, diodes) of an integrated circuit. For example, FIG. 3 shows FET 307 (either a PFET or NFET), which includes a source region 308 and a drain region 310 located in substrate 303. In the embodiment shown, FET 307 is a planar transistor. However, in other embodiments, substrate 303 would include semiconductor regions for other types of transistors such as e.g., bipolar transistors, JFETs (junction field-effect transistors), and FinFETs (not shown), stacked transistors, nanotube and multi-sheet transistors, as well as semiconductor regions for of other types of semiconductor devices such as e.g., diodes (not shown).

Wafer 301 includes an interconnect layer 305 located over substrate 303 that includes conductive electrical interconnects (323) and vias (321), and includes intervening dielectric material 309 that provides electrical isolation of these conductive structures. The conductive structures of interconnect layer 305 provide conductive paths between the semiconductor device terminals and conductive paths from the terminals to circuitry external to integrated circuit 301 (not shown).

In the embodiment of FIG. 3, the electrical interconnects of layer 305 are implemented in four metal interconnect layers 341-344. A metal interconnect layer of an integrated circuit is a layer that includes one or more electrical interconnects that provide a conductive lateral path in the layer and includes intralayer dielectric material (part of dielectric material 309) that laterally isolate the interconnects in the layer. For example, metal interconnect layer 342 includes electrical interconnect 323 and top metal interconnect layer 344 includes electrical interconnect 325. The electrical interconnects are made of conductive material (e.g., copper, aluminum, gold) and may include conductive barrier layers (e.g., titanium and titanium nitride).

Interlayer dielectric material (part of dielectric material 309) is located between the metal interconnect layers 341-

344 for electrical isolation. Conductive vias (313) located in the interlayer dielectric material provide conductive paths between interconnects of the different metal interconnect layers. For example, conductive via 322 provides a conductive path from interconnect 329 of layer 343 to interconnect 323 of layer 342. In the embodiment shown, the interconnects of the different metal layers are of different thicknesses and the metals interconnect layers have different spacings between the layers. Although four metal interconnect layers are shown in FIG. 3, other embodiments may include a different number of metal interconnect layers.

In some embodiments, the metal interconnect layers and vias are formed by forming openings in a dielectric layer (e.g., oxide) of material 309, depositing a conductive metal (e.g., copper, aluminum, gold) in the opening, then planarizing the wafer. In other embodiments, an interconnect may be formed by depositing a metal layer on a dielectric layer of material 309 and then patterning the metal layer. In some embodiments, a conductive interconnect and underlaying vias may be formed by a double damascene process. In some embodiments, the interconnects and vias may include barrier layers of e.g., titanium and titanium nitride (not shown).

A passivation layer 331 is formed over layer 305. A passivation layer is a layer of one or more dielectric layers that protect an integrated circuit from chemical contamination, e.g., corrosion, that may occur during the subsequent packaging process or from additional packaging structures. In one embodiment, passivation layer 331 is made of nitride and has a thickness of 20 A, but may be of other thicknesses (e.g., 5-5000 A), be made of other materials, and/or formed by other processes in other embodiments. For example, in some embodiments, layer 331 may be made of silicon nitride, silicon oxynitride, silicon carbon nitride, silicon oxide, silicon dioxide, or a polymer. In some embodiments, passivation layer 331 may be made of multiple layers of different passivation materials. For example, passivation layer 331 may include a silicon-dioxide layer, a silicon-oxynitride layer, and a silicon-nitride layer.

In the embodiment shown, stress-setting dopants are selectively implanted into layer 331 at region 333 and region 335 to alter the stress profile of layer 331 at region 333 and at region 335 to compensate for stress from packaging structures such as subsequently formed die-terminal structures (pillars 403 and 405 in FIG. 4) encapsulant (503 in FIG. 5), a package board (505 in FIG. 5) and package pads (507 in FIG. 5).

In the embodiment shown, region 333 is located in an area 304 of wafer 301 that will be located in a portion of an integrated circuit package where substrate 303 will be under a compressive stress due to stresses caused by the packaging structures. To counter the compressive stress imparted in substrate 303 by the package structures in area 304, region 333 will be implanted with stress-setting dopants such that region 333 will be under a compressive stress to impart a tensile stress on area 304 of substrate 303, thereby neutralizing the effects of the compressive stress imparted by the packaging structures. As a result, the net stress effect on area 306 in substrate 303 will be neutral or at a desired stress level and type set by a stressor located closer to the substrate (e.g., see stressors 131 and 133 of FIG. 1).

In one embodiment where layer 331 is made of silicon nitride, region 333 is made under a compressive stress by selectively implanting nitrogen dopants into region 333 at a dosage of $1e^{13}$ to $5e^{15}$ atoms/cm$^2$ and at an energy of 0.8 to 10 keV while the other portions of layer 331 are masked (mask not shown in FIG. 3) to prevent the implantation of dopants or implant damage in those areas (such as in regions 334 and 335 of layer 331). However, other types of dopant species such as xenon, boron, phosphorus, oxygen, argon, hydrogen, helium, fluorine, germanium, and/or silicon at sufficient doses may be used to make region 333 compressive. The particular dosage and energy would depend upon the species, the type of passivation film, and its intrinsic residual stress. For most species, implantation of a relatively high dosage will cause a region to become compressive due to the heating caused by the high dosage implants.

In the embodiment shown, region 335 is located in an area 306 of wafer 301 that will be located in a portion of an integrated circuit package where substrate 303 will be under a tensile stress due to stresses caused by packaging structures. To counter the tensile stress imparted by the package structures in area 306, region 335 will be implanted with stress-setting dopants such that region 335 will be under a tensile stress to impart a compressive stress on area 306 of substrate 303, thereby neutralizing the effects of the tensile stress imparted by the packaging structures.

In one embodiment, where layer 331 is made of silicon dioxide, region 335 is made under a tensile stress by implanting $Xe^{+4}$ dopants into region 335 at a dosage of $4e^{13}$/cm$^2$ and an energy of 4 MeV while the other portions of layer 331 are masked to prevent the implantation of dopants into those areas. However, other types of dopant species such as xenon, boron, phosphorus, oxygen, argon, hydrogen, helium, fluorine, germanium, and/or silicon may be used. The particular dosage and energy would depend upon the species, the type of passivation film, and its intrinsic residual stress. For most species, implantation at a relatively lower dosage will cause a region to become tensile. For most species, the dosage for making a layer tensile is less than the dosage for making the layer compressive.

In some embodiments, where layer 331 is a multilayer passivation layer, stress-setting dopants may be implanted into less than all of the layers of the passivation layer. For example, where passivation layer 331 is made of a layer of silicon dioxide and a layer of silicon nitride (e.g., Si$^3$N$^4$), dopants may be implanted into the silicon dioxide layer and not the silicon nitride layer to make region 335 under a tensile stress and implanted into the silicon nitride layer and not the silicon dioxide layer to make region 333 under a compressive stress.

In the embodiment shown, other portions of layer 331 (e.g., region 334) are not implanted with stress-setting dopants. However, in some embodiments, these regions may include dopants that are of the same species as the implanted dopants but are at a significantly lower concentration. For example, a region implanted with a species of stress-setting dopants to adjust the doping profile would be at a concentration of at least five atomic percent greater than a region that was not implanted with stress-setting dopants.

After the stress-setting dopants have been implanted, a low temperature anneal (e.g., 350-400 C) is performed. In some embodiments, an another anneal would be performed to repair ion implantation damage.

In one embodiment, the implantation of the stress-setting dopants is performed by an ion-implantation process. In other embodiments, the implantation of the stress-setting dopants is performed by a plasma-immersion-implantation process. In one embodiment, a plasma-implantation process may be performed with lower-cost equipment than the equipment used to perform an ion-implantation process.

In the embodiment shown, both a region under compressive stress (region 333) and a region under tensile stress (region 335) are formed in passivation layer 331. However, in some embodiments, only tensile regions are formed or only compressive regions are formed in the passivation layer.

Figure 4:
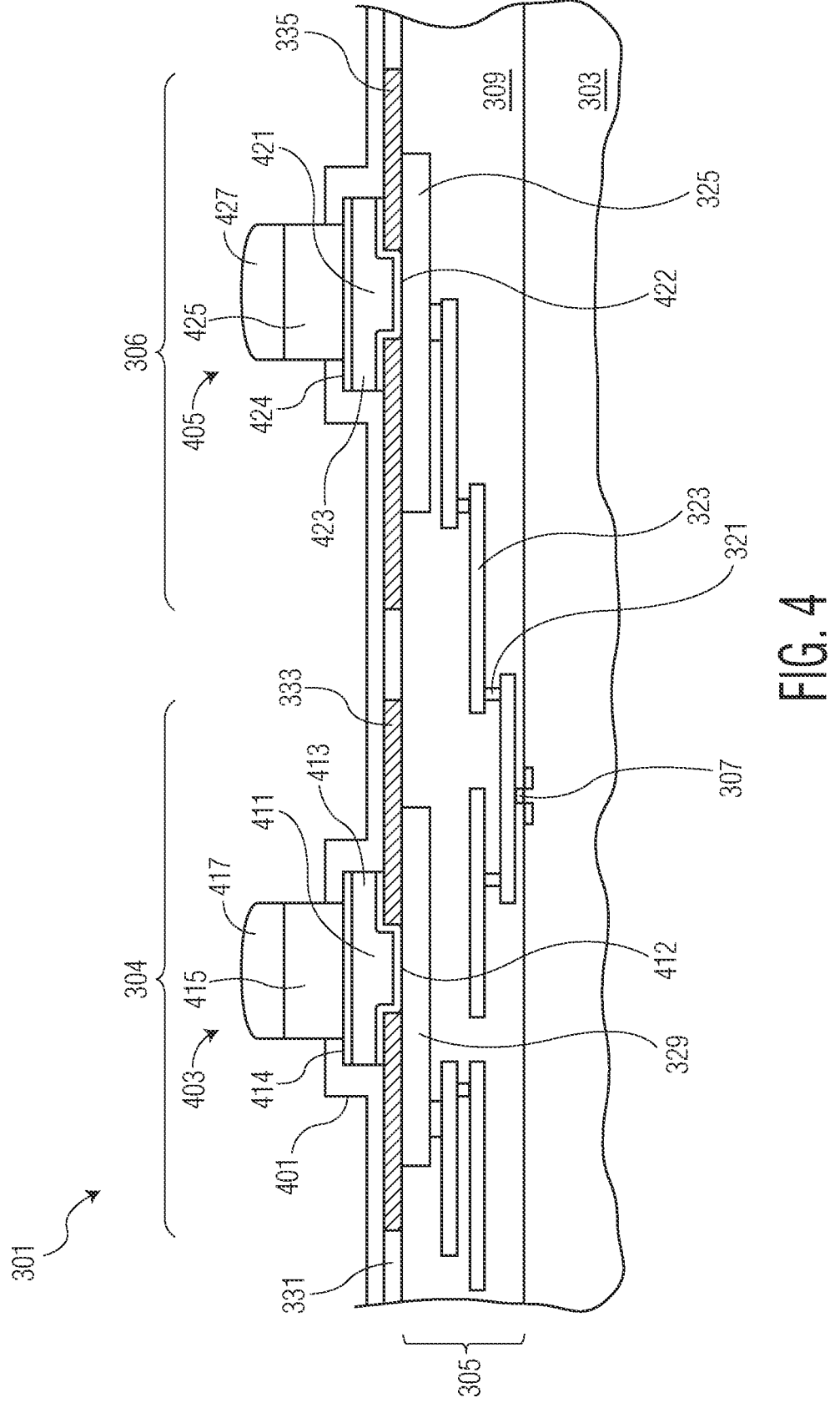
FIG. 4 is a partial cross-sectional side view of a wafer during another stage of its manufacture according to one embodiment of the present invention.

FIG. 4 is a partial cutaway side view of wafer 301 after pillars 403 and 405 have been added. After the stage of FIG. 3, opening 411 is formed in region 333 to expose interconnect 329 and opening 421 is formed in region 335 to expose interconnect 325. Afterwards, a layer of barrier material (e.g., titanium or titanium nitride) is formed over wafer 301, including in openings 411 and 421 to contact interconnects 329 and 325, followed by a layer of aluminum, and then followed by another layer of barrier material. The three layers (barrier, aluminum, and barrier) are then patterned to form a pad in area 304 that includes barrier layer portion 412, aluminum portion 413, and barrier layer portion 414, and to form a pad in area 306 that includes barrier-layer portion 422, aluminum portion 423, and barrier-layer portion 424.

A second passivation layer 401 is formed over wafer 301. Openings are then formed in layer 401 to expose barrier layer portions 414 and 424. Copper pillar portions 415 and 425 of pillars 403 and 405, respectively, are then formed in the openings (e.g., by plating). Solder caps 417 and 427 are formed on portions 415 and 425, respectively. In other embodiments, pillars 403 and 405 may be formed by other methods, have other configurations, and/or be made of other materials in other embodiments. Integrated circuits of other embodiments may utilize other types of die terminals such as bond pads, posts, or bumps.

Figure 5:
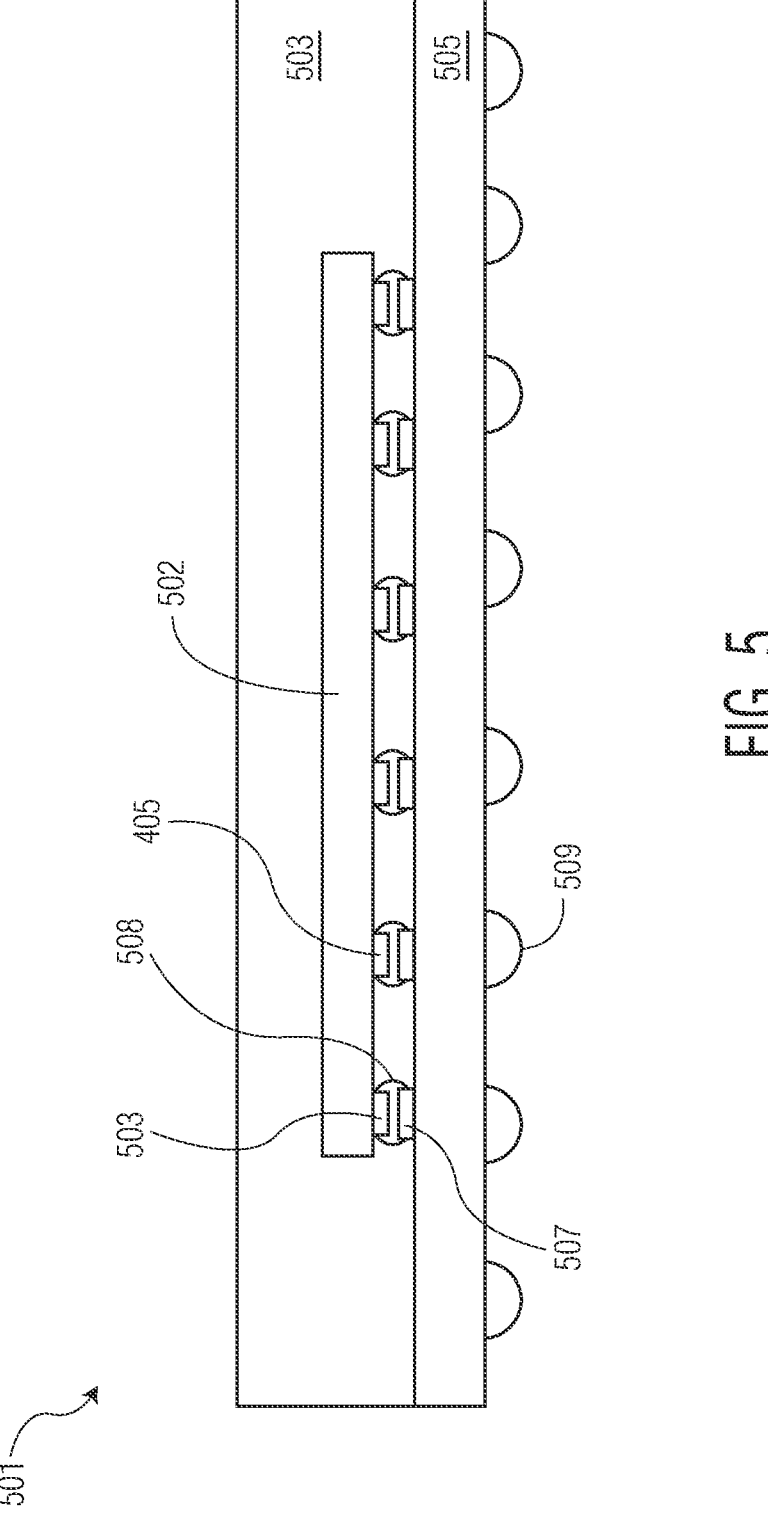
FIG. 5 is a cutaway side view of a packaged integrated circuit according to one embodiment of the present invention.

FIG. 5 is a cross-sectional side view of a packaged integrated circuit 501 according to one embodiment of the present invention. After the formation of pillars 403 and 405, wafer 301 is singulated into multiple integrated circuits including integrated circuit 502, where each integrated circuit includes multiple semiconductor devices. Integrated circuit 502 includes die terminals (e.g., pillars 403 and 405) located on one side (e.g., the bottom side in the view of FIG. 5) of integrated circuit 502. In the embodiment shown, the pillars (403 and 405) are electrically attached to package board pads (507) of package board 505. Package board 505 includes embedded conductors (not shown) to electrically couple board pads (507) to solder balls (509). Integrated circuit 502 is encapsulated in an encapsulant 503. Other integrated circuit packages may have other structures or packaging configurations in other embodiments. For example, in some embodiments, a packaged integrated circuit may be oriented with die terminals such as bond pads facing upward and include wire bonds (not shown). In other embodiments, a packaged integrated circuit may include a lead frame (not shown).

In addition to the stress caused by pillars (403 and 405), stress can also be generated on the substrate of integrated circuit 502 by package board 505, package pads 507, and solder 508 though the pillars as well as by encapsulant 503. Accordingly, selectively implanting stress-setting dopants into passivation layer 331 can tune the stress induced in a channel region to adjust for the package-structure stress that may be location-dependent.

In some embodiments, the effect the stress of a die terminal and other package structures decreases laterally from the die terminal. Accordingly, to compensate for this decrease in stress from the die terminal, the concentration of stress-setting dopants can be decreased as the lateral distance from a die terminal decreases.

Figure 6:
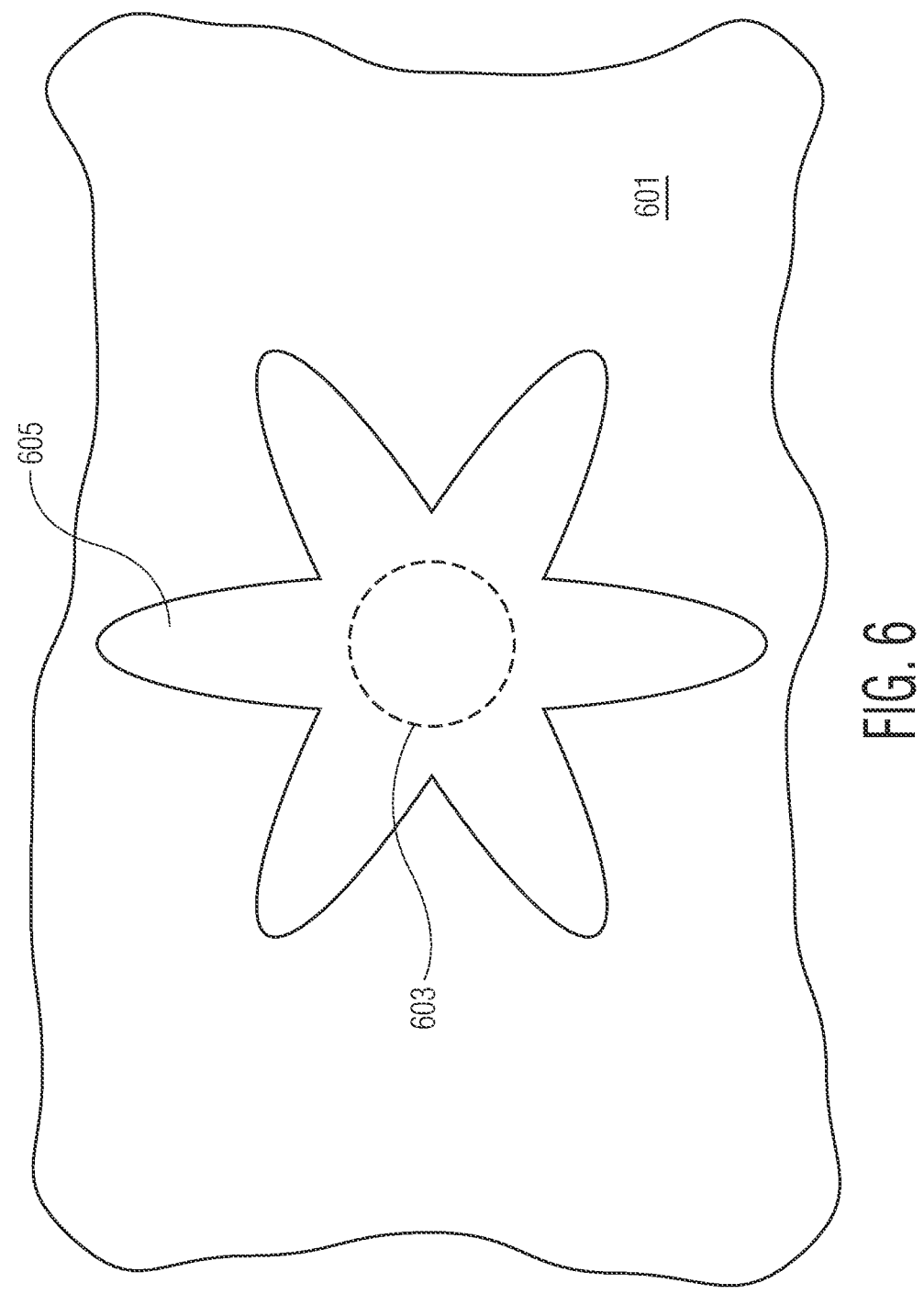
FIG. 6 is a partial top view of a passivation layer according to an embodiment of the present invention.

FIG. 6 is a top view of a passivation layer 601 of an integrated circuit (similar to passivation layer 331 in FIG. 3) showing an implant region 605 of stress-setting dopants located with respect to the location 603 of a subsequently formed die terminal. The other portions of layer 601 shown are not implanted with stress-setting dopants. In the embodiment of FIG. 6, the doped region 605 has a flower shape with petals radiating out from the center such that the net concentration of dopants at equilateral distances from location 603 decreases with the lateral distance. With such a configuration, the stress imparted by region 605 decreases as the lateral distance from location 603 decreases so as to match the decrease in the effect of the stress of the die terminal as the lateral distance from the die terminal increases.

Figure 7:
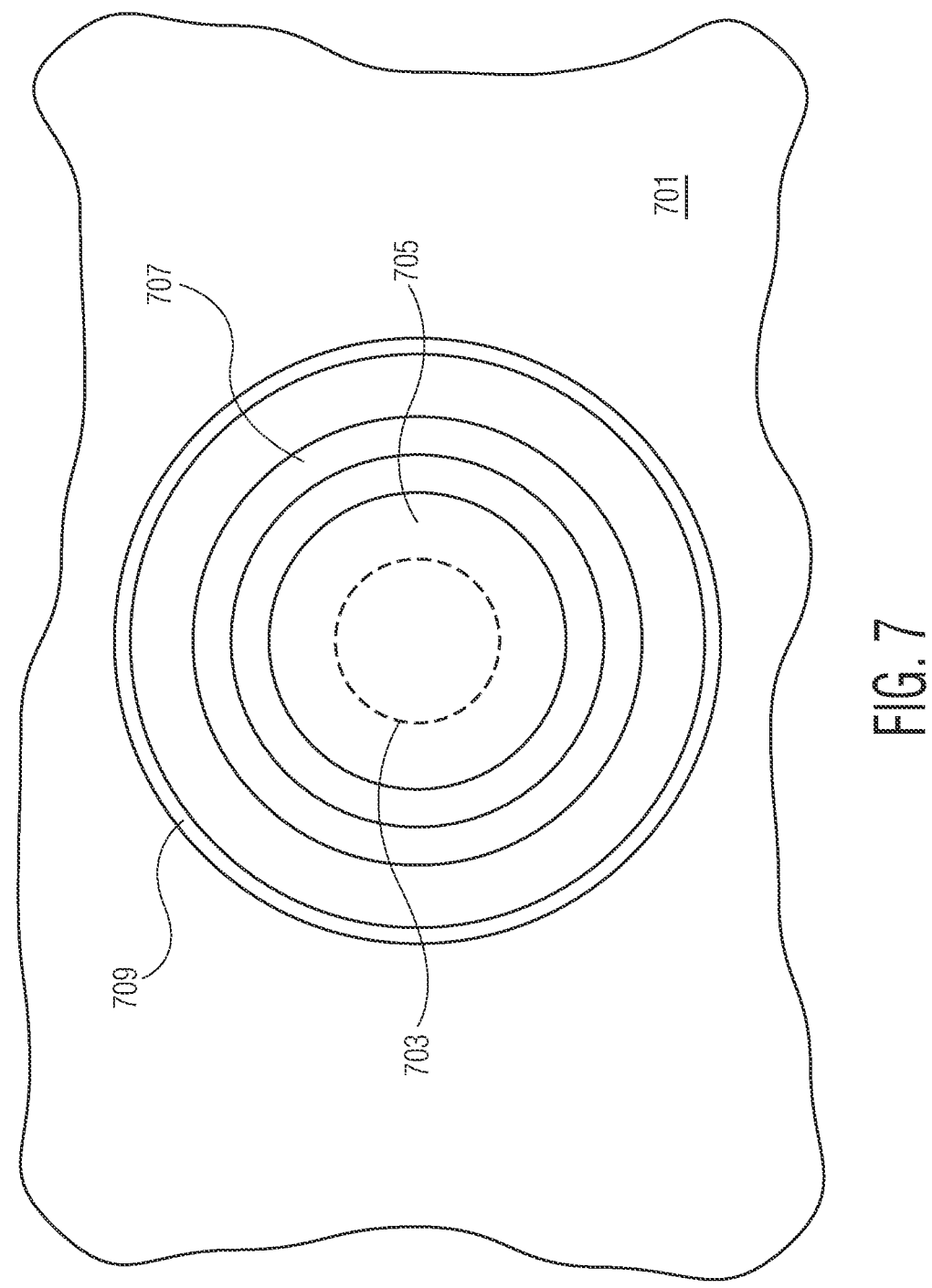
FIG. 7 is a partial top view of a passivation layer according to another embodiment of the present invention.

FIG. 7 is a top view of passivation layer 701 showing implant regions 705, 707, and 709 of stress-setting dopants located with respect to the location 703 of a subsequently formed die terminal. The other portions of layer 701 shown are not implanted with stress-setting dopants. In the embodiment of FIG. 7, implanted region 705 has a circular shape and regions 707, and 709 have a circular ring shape that decreases in radial thickness and spacing from an adjacent ring region the further the lateral distance from location 703. With the design of FIG. 7, the amount of stress imparted by the regions decreases with the lateral distance from location 703 due to the decrease in thickness and area. In other embodiments, the implanted ring regions may have a non-circular shape or may be broken into segments.

Figure 8:
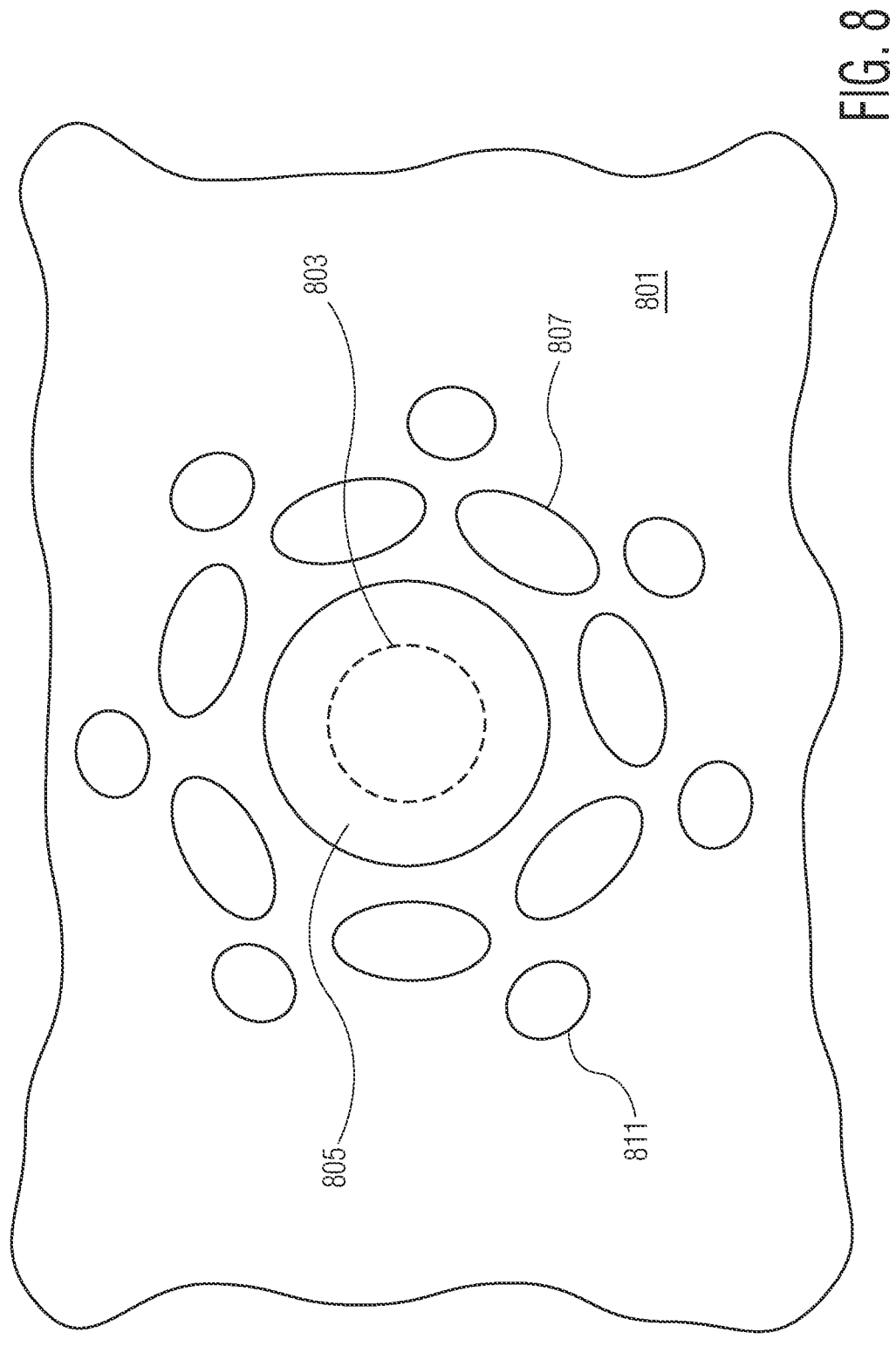
FIG. 8 is a partial top view of a passivation layer according to another embodiment of the present invention.

FIG. 8 is a top view of a passivation layer 801 showing multiple implant regions 805, 807, and 811 of stress-setting dopants located with respect to a location 803 of a subsequently formed die terminal. The other portions of layer 801 shown are not implanted with stress-setting dopants. In FIG. 8, region 805 has a circular shape. Regions 807 are smaller doped regions that surround region 805. Regions 811 are still smaller doped regions that surround regions 807. With this configuration, the net concentration of stress-setting dopants decreases laterally from location 803 so that the stress imparted by the doped regions decrease as the lateral distance form location 803 increases. Other embodiments may include other spatial patterns where the stress-setting dopant regions decrease in size and density as the distance from the location of the die terminal decreases.

As shown in FIGS. 6-8, all of the doped regions have the same stress-setting dopant concentration. However, because the total area implanted decreases with the increase in the lateral distance from the location of the die terminal, the net concentration of dopants implanted in the passivation layer decreases as the lateral distance from the location of the die terminal increases. With FIGS. 6-8, by decreasing the total area being implanted as the lateral distance from the die terminal increases, the decrease in net concentration can be accomplished by using only one mask (not shown) for selective dopant implantation.

Figure 9:
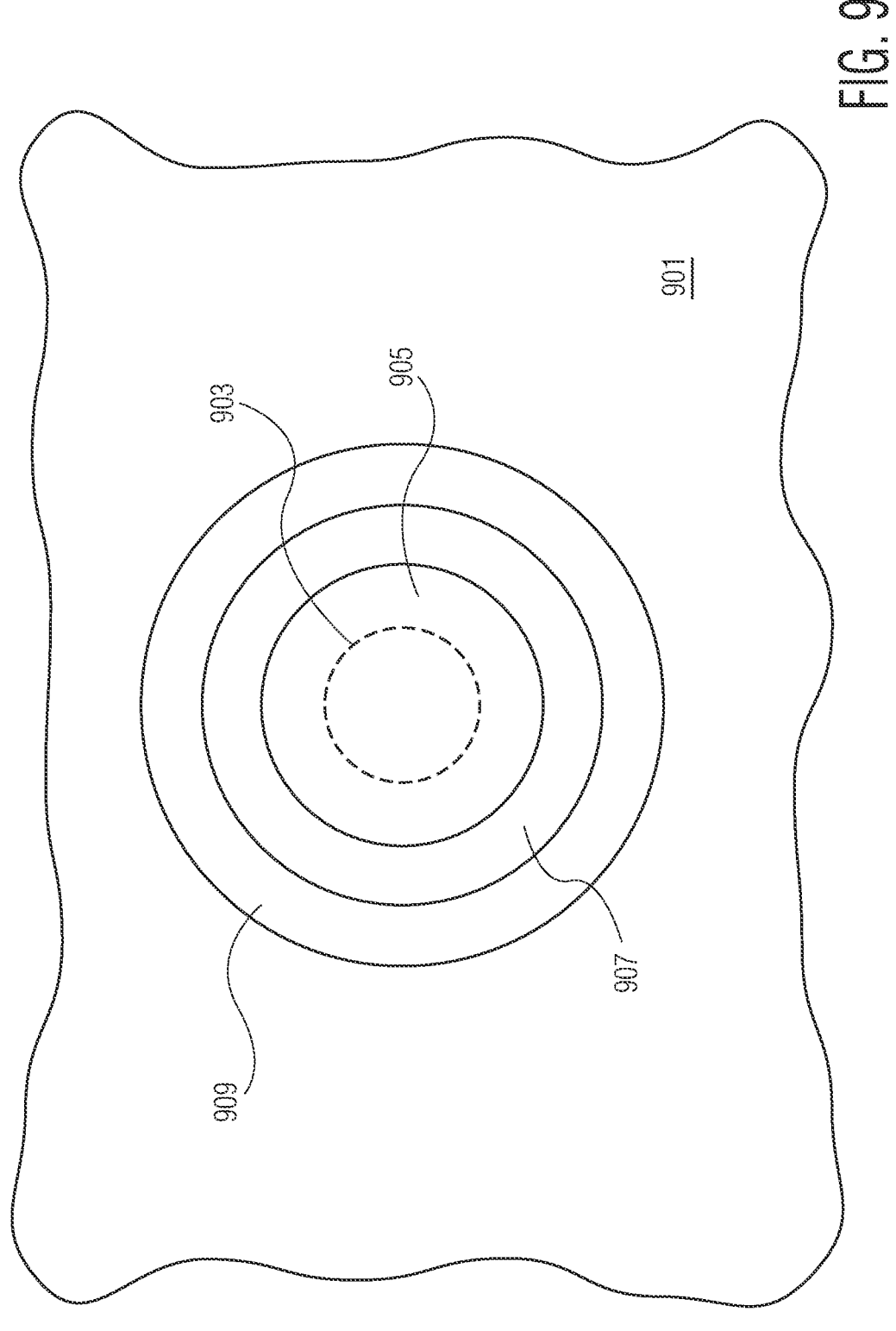
FIG. 9 is a partial top view of a passivation layer according to another embodiment of the present invention.

FIG. 9 shows another embodiment of a top view of a passivation layer 901 where the net concentration of dopants implanted in the passivation layer decreases as the lateral distance from a location 903 of a die terminal increases. In the embodiment of FIG. 9, the implanted regions 909, 907 and 905 have different dopant concentrations with region 905 having the highest concentration, region 907 having the second-highest concentration, and region 909 having the lowest concentration. The other portions of layer 901 shown are not doped with stress-setting dopants. In the embodiment of FIG. 9, regions 905, 907, and 905 are implanted using multiple implantation steps using different masks to achieve the different concentration levels. In one embodiment, a first mask having an opening the shape of the outer perimeter of region 909 is formed over layer 901 wherein stress-setting dopants are implanted in the opening at a final concentration of region 909. As second mask is formed over layer 901 with an opening in the shape of the outer perimeter of region 907. A second implantation is performed at a dopant concentration of the final concentration of region 907 minus the final concentration of region 909 (the concentration of the previous implantation process). A third mask is formed over layer 901 with an opening in a shape defined by the outer perimeter of region 905. A third implantation is performed at a dopant concentration of the final concentration of region 905 minus the final concentration of region 907 (the concentrations of the previous two implantation processes).

In the embodiment of FIGS. 6-9, the net doping concentration is shown as being symmetrical around the die terminal location. However, the implanted regions may be adjusted to account for non symmetrical stress effects of the die terminals. In some embodiments, areas of a substrate may be affected by stress from multiple die terminals. Accordingly, the net amount of stress-setting dopants implanted into an area can be adjusted to compensate for the stress in the substrate from multiple sources. For example, referring back to FIG. 2, the selectively doped regions can be chosen so as to match the location, magnitude, and type (e.g., tensile or compressive) of the stress imparted by the package structures at a particular location.

Figure 10:
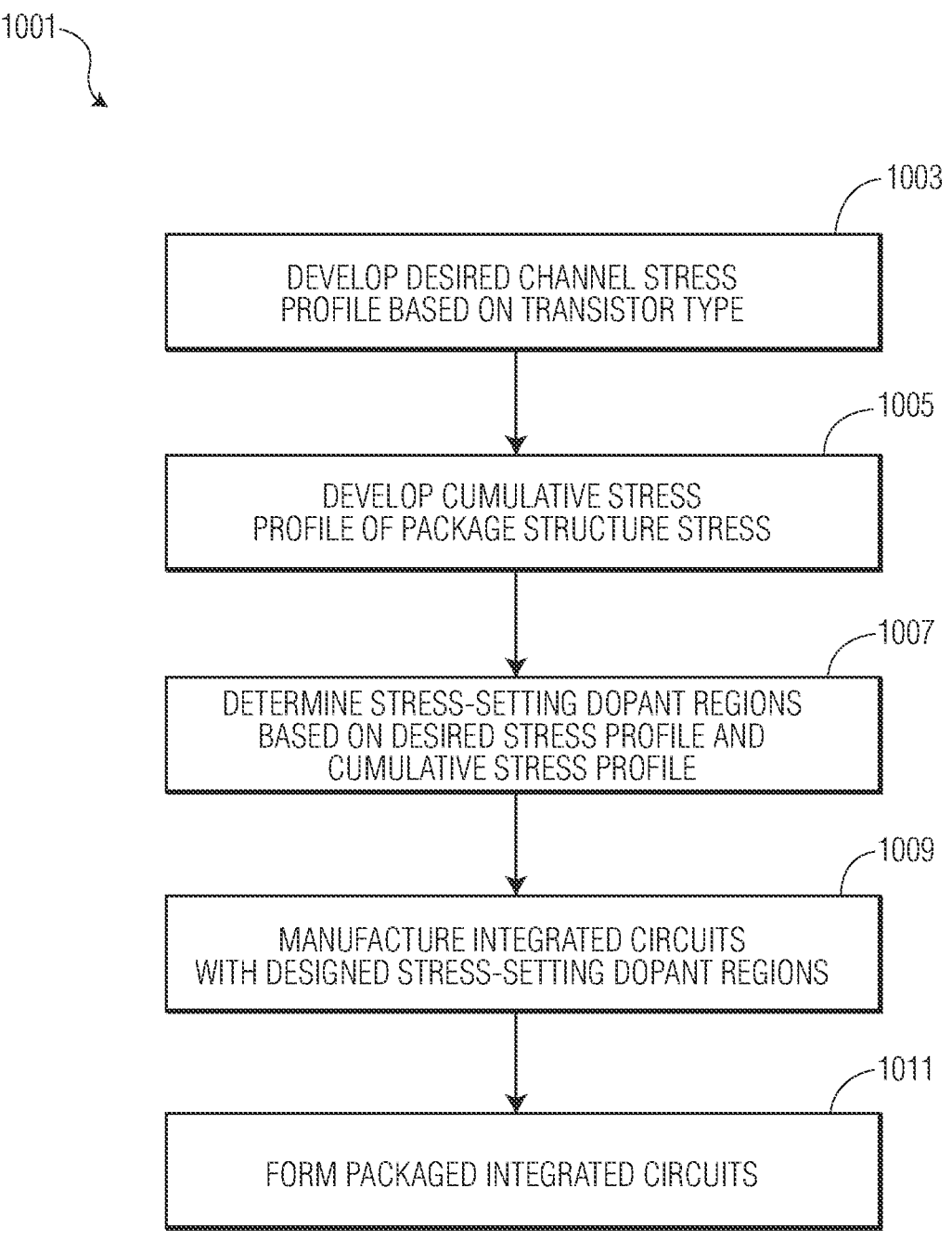
FIG. 10 is a flow diagram of a method for making a packaged integrated circuit according to one embodiment of the present invention.

FIG. 10 is a flow chart illustrating a method 1001 for designing and making a packaged integrated circuit according to one embodiment of the present invention. Method 1001 begins by developing a desired channel stress profile for the transistors (and other semiconductor devices) of an integrated circuit in operation 1003. In one embodiment, for each transistor, the desired channel stress profile developed is based on the conductivity type of the transistor (e.g., N-type or P-type), the size of the transistor, and the desired drive current of the transistor.

In operation 1005, a profile of the cumulative stress effects of the package structures on the substrate of an integrated circuit is developed. The profile indicates the cumulative package structure stress at each channel location of the integrated circuit. In one embodiment, operation 1005 may be performed prior to operation 1003.

At operation 1007, the locations of the stress-setting dopants in the passivation layer or other dielectric layers are determined based on the desired stress profile developed in operation 1003 and the package-structure stress profile developed in operation 1005. In one embodiment, the locations are selected to provide the desired stress in the channels of each transistor compensating for the package stress on the channel at each location. The plan is implemented in the wafer mask set and process recipes for making the wafer of the integrated circuit. Operations 1003, 1005, and 1007 may be performed with computer-aided design (CAD) tools used for integrated circuit design.

In operation 1009, integrated circuits are manufactured to have the stress-setting dopant implants in the selected regions. In one embodiment, the semiconductor devices, overlying metal interconnect layers, and the die terminals are formed on a wafer that is then singulated to form multiple integrated circuits. In operation 1011, the integrated circuits are packaged to form packaged integrated circuits. An integrated circuit with selectively implanted regions of stress-setting dopants may be designed and/or made by other processes in other embodiments.

As described above, stress-setting dopants are implanted into a passivation layer (e.g., 331). However, the dopants may be implanted in other dielectric layers for controlling stress. For example, stress-setting dopants maybe implanted into other passivation layers (e.g., passivation layer 401)

and/or implanted into at least one or more dielectric layers of interconnect layer 305 so as to counter the stress of the package structures.

Providing an integrated circuit with selectively implanted regions of stress-setting dopants in a dielectric layer over one or more metal interconnect layers may provide a mechanism for countering the stress imparted by packaging structures. Furthermore, such a method may allow for package stress compensation to occur at higher levels of the IC such that the compensation is independent of substrate and lower-level design. For example, because stress compensation occurs at the upper integrated circuit levels such as at the passivation layers, the substrate processing operations and etch-stop processing operations for forming the integrated circuit do not have to be modified for changes to the packaging structures that impart stress to the substrate.

Providing an integrated circuit with selectively implanted regions of stress-setting dopants over one or more metal interconnect layers may also allow for the stresses of the channel regions of an integrated circuit to be individually adjusted at different locations of an integrated circuit. Accordingly, with some embodiments, the location of the stress-setting dopants in the passivation layer (or in other upper dielectric layers) may be used to adjust the stress of a channel region beyond what is needed to counter package stress so as to further improve transistor performance.

Accordingly, in some embodiments, the use of selectively implanted regions in a dielectric layer above one or more metal interconnect layers may allow for the reduction or elimination of the use of stressors (e.g., stressors 131 and 133) located on the substrate.

Furthermore, the stress-setting dopants can also be used to counter packaging structure stress at other locations of the IC and/or locations of the packaged integrated circuit. Such a reduction in stress may be beneficial for integrated circuit package integrity.

A source region and a drain region are current terminal regions for a FET and a gate is a control terminal for a FET. A stress profile of a region or structure defines the type of stress (tensile or compressive) that the region or structure is under and the magnitude of that stress. An active region of a transistor includes the regions in the substrate of semiconductor material for the terminals of the transistor (e.g., current terminals and control terminals if present in the substrate) and semiconductor pathways that conduct carriers between the terminals of the transistor. For a FET, the active area would include the source region, the drain region, and the channel region.

As disclosed herein, a first structure is "directly over" a second structure if the first structure is located over the second structure in a line having a direction that is perpendicular with a generally planar major side of the wafer or substrate. For example, in FIG. 4, pillar portion 425 is directly over interconnect 325. Pillar portion 425 is not directly over transistor 307. As disclosed herein, a first structure is "directly beneath" or "directly under" a second structure if the first structure is located beneath the second structure in a line having a direction that is perpendicular with a generally planar major side of the wafer or substrate. For example, in FIG. 4, interconnect 329 is directly beneath pillar portion 415. Interconnect 329 is not directly beneath pillar portion 425. One structure is "directly between" two other structures in a line if the two structures are located on opposite sides of the one structure in the line. For example, in FIG. 1, STI 119 is located directly between STI 117 and STI 120 in a line in the cut away side view of FIG. 1. STI 119 is not located directly between gates 121 and 123 in a line. A first structure is "directly lateral" to a second structure if the first structure and second structure are located in a line having a direction that is parallel with a generally planar major side of the wafer or substrate. For example, gate 121 and gate 123 are directly lateral to each other. One structure is "directly laterally between" two other structures if the two structures are located on opposite sides of the one structure in a line that is parallel with a generally planar major side of the wafer or substrate. For example, in FIG. 1, STI 119 is located directly laterally between STI 117 and STI 120. A surface is at a "higher elevation" than another surface if that surface is located closer to the top of the active side of a wafer or integrated circuit in a line having a direction that is perpendicular with the generally planar major side of the wafer or integrated circuit. In the view of FIG. 4, the active side of wafer 301 is the top side of the FIG. 4. For example, pillar portion 415 is at a higher elevation than interconnect 323.

Features specifically shown or described with respect to one embodiment set forth herein may be implemented in other embodiments set forth herein.

In one embodiment, an integrated circuit includes a substrate including semiconductor regions for one or more semiconductor devices and one or more metal interconnect layers including electrical interconnect structures electrically coupled to semiconductor regions of the substrate. The integrated circuit includes a plurality of die terminals. Each die terminal is electrically coupled to an electrical interconnect structure of the one or more metal interconnect layers. The integrated circuit includes a dielectric layer located over the one or more metal interconnect layers. The dielectric layer includes a plurality of openings, wherein electrically conductive material resides in the openings of the plurality of openings and are electrically coupled to electrical interconnect structures of the one or more metal interconnect layers. The dielectric layer includes a first region including selectively implanted stress-setting dopants and a second region that lacks the selectively implanted stress-setting dopants.

In another embodiment, an integrated circuit includes a substrate including semiconductor regions for one or more semiconductor devices, one or more metal interconnect layers including electrical interconnect structures electrically coupled to semiconductor regions of the substrate, and a dielectric layer located over the one or more metal interconnect layers. The dielectric layer including a plurality of openings, wherein electrically conductive material resides in the openings of the plurality of openings and are electrically coupled to electrical interconnect structures of the one or more metal interconnect layers. The dielectric layer includes a first region and a second region. The second region is directly lateral to the first region, wherein the first region has a concentration of a first species of dopants that is at least five atomic percent greater than a concentration of the first species of dopants in the second region.

In another embodiment, a method includes forming semiconductor regions for semiconductor devices in a substrate and forming one or more metal interconnect layers over the substrate. The one or more metal interconnect layers include electrical interconnect structures electrically coupled to semiconductor regions of the substrate. The method includes forming a plurality of die terminals, wherein each die terminal is electrically coupled to an electrical interconnect structure of the one or more metal interconnect layers. The method includes forming a dielectric layer located over the one or more metal interconnect layers and selectively implanting stress-setting dopants into a first region of the dielectric layer wherein a second region of the dielectric layer is masked from being implanted with the stress-setting dopants.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
a substrate including semiconductor regions for one or more semiconductor devices;
one or more metal interconnect layers including electrical interconnect structures electrically coupled to semiconductor regions of the substrate;
a plurality of die terminals, wherein each die terminal is electrically coupled to an electrical interconnect structure of the one or more metal interconnect layers;
a dielectric layer located over the one or more metal interconnect layers, the dielectric layer including a plurality of openings, wherein electrically conductive material resides in the openings of the plurality of openings and are electrically coupled to electrical interconnect structures of the one or more metal interconnect layers;
wherein the dielectric layer includes a first region including selectively implanted stress-setting dopants and a second region that lacks the selectively implanted stress-setting dopants;
wherein the dielectric layer includes a third region that includes selectively implanted stress-setting dopants;
wherein the selectively implanted stress-setting dopants in the first region provide the first region with a first stress profile, where the first region is under a first type of stress and the selectively implanted stress-setting dopants implanted into the third region provide the third region with a second stress profile, where the second region is under a second type of stress that is opposite of the first type of stress.

2. The integrated circuit of claim 1, wherein the first region and the second region are each laterally closest to a first die terminal, wherein the first region is laterally closer to the first die terminal than to the second region.

3. The integrated circuit of claim 1, wherein the dielectric layer includes nitride.

4. The integrated circuit of claim 1, wherein the selectively implanted stress-setting dopants provide the first region with a first stress profile where the first region is under a stress that is greater in magnitude than the second region.

5. The integrated circuit of claim 1, wherein selectively implanted stress-setting dopants in the first region are of a first species of dopants, wherein the first region has a concentration of the first species of dopants that is at least five atomic percent greater than a concentration of the first species of dopants in the second region.

6. The integrated circuit of claim 5, wherein the first species includes one of the group consisting of xenon, boron, phosphorus, oxygen, argon, nitrogen, hydrogen, helium, fluorine, germanium, and silicon.

7. The integrated circuit of claim 1, wherein the selectively implanted stress-setting dopants provide a first stress profile to the first region and wherein the second region has a second stress profile that is different than the first stress profile.

8. The integrated circuit of claim 1, wherein the first region is located closest to a first die terminal of the plurality of die terminals, wherein a concentration of stress-setting dopants in a first portion of the first region is of a higher concentration than a concentration of stress-setting dopants in a second portion of the first region, wherein the second portion is located laterally further away from the first die terminal than the first portion.

9. The integrated circuit of claim 1, wherein the dielectric layer is characterized as a passivation layer.

10. A packaged integrated circuit including the integrated circuit of claim 1.

11. An integrated circuit comprising:
  a substrate including semiconductor regions for one or more semiconductor devices;
  one or more metal interconnect layers including electrical interconnect structures electrically coupled to semiconductor regions of the substrate;
  a dielectric layer located over the one or more metal interconnect layers, the dielectric layer including a plurality of openings, wherein electrically conductive material resides in the openings of the plurality of openings and are electrically coupled to electrical interconnect structures of the one or more metal interconnect layers;
  wherein the dielectric layer includes a first region and a second region, the second region is directly lateral to the first region, wherein the first region has a concentration of a first species of dopants that is at least five atomic percent greater than a concentration of the first species of dopants in the second region;
  wherein the dielectric layer includes a third region that includes selectively implanted stress-setting dopants that are at least one of the group of a different species and of a different concentration than the first species of dopants in the first region.

12. The integrated circuit of claim 11, wherein the first species of dopants in the first region provide the first region with a first stress profile where the first region is under a first type of stress and the selectively implanted stress-setting dopants implanted into the third region provide the third region with a second stress profile, where the third region is under a second type of stress that is opposite of the first type of stress.

13. The integrated circuit of claim 11, wherein the dielectric layer is characterized as a passivation layer.

14. The integrated circuit of claim 11, wherein the first species includes one of the group consisting of xenon, boron, phosphorus, oxygen, argon, nitrogen, hydrogen, helium, fluorine, germanium, and silicon.

15. The integrated circuit of claim 11, wherein the first species of dopants provide a first stress profile to the first region and wherein the second region has a second stress profile is different than the first stress profile.

16. A packaged integrated circuit including the integrated circuit of claim 11.

17. An integrated circuit comprising:
  a substrate including semiconductor regions for one or more semiconductor devices;

one or more metal interconnect layers including electrical interconnect structures electrically coupled to semiconductor regions of the substrate;
  a plurality of die terminals, wherein each die terminal is electrically coupled to an electrical interconnect structure of the one or more metal interconnect layers;
  a dielectric layer located over the one or more metal interconnect layers, the dielectric layer including a plurality of openings, wherein electrically conductive material resides in the openings of the plurality of openings and are electrically coupled to electrical interconnect structures of the one or more metal interconnect layers;
  wherein the dielectric layer includes a first region including selectively implanted stress-setting dopants and a second region that lacks the selectively implanted stress-setting dopants;
  wherein the dielectric layer includes a third region that includes selectively implanted stress-setting dopants that are at least one of the group of a different species and of a different concentration than the selectively implanted stress-setting dopants in the first region.

18. The integrated circuit of claim 17, wherein the selectively implanted stress-setting dopants in the first region provide the first region with a first stress profile where the first region is under a first type of stress and the selectively implanted stress-setting dopants implanted in the third region provide the third region with a second stress profile, where the third region is under a second type of stress that is opposite of the first type of stress.

19. An integrated circuit comprising:
  a substrate including semiconductor regions for one or more semiconductor devices;
  one or more metal interconnect layers including electrical interconnect structures electrically coupled to semiconductor regions of the substrate;
  a dielectric layer located over the one or more metal interconnect layers, the dielectric layer including a plurality of openings, wherein electrically conductive material resides in the openings of the plurality of openings and are electrically coupled to electrical interconnect structures of the one or more metal interconnect layers;
  wherein the dielectric layer includes a first region and a second region, the second region is directly lateral to the first region, wherein the first region has a concentration of a first species of dopants that is at least five atomic percent greater than a concentration of the first species of dopants in the second region;
  wherein the dielectric layer includes a third region that includes selectively implanted stress-setting dopants;
  wherein the concentration of a first species dopants in the first region provides the first region with a first stress profile, where the first region is under a first type of stress, and the selectively implanted stress-setting dopants in the third region provides the third region with a second stress profile, where the second region is under a second type of stress that is opposite of the first type of stress.

* * * * *